(12) United States Patent
Yalamanchili et al.

(10) Patent No.: US 8,475,056 B2
(45) Date of Patent: *Jul. 2, 2013

(54) SEMICONDUCTOR DEVICE ASSEMBLY

(75) Inventors: Prasad Yalamanchili, Santa Clara, CA (US); Xiangdong Qiu, Cupertino, CA (US); Reddy Raju, Fremont, CA (US); Jay A. Skidmore, San Jose, CA (US); Michael Au, Fremont, CA (US); Laura Zavala, Mountain view, CA (US); Richard L. Duesterberg, Mountain View, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 386 days.

This patent is subject to a terminal disclaimer.

(21) Appl. No.: 12/843,823

(22) Filed: Jul. 26, 2010

(65) Prior Publication Data

US 2011/0026877 A1  Feb. 3, 2011

Related U.S. Application Data

(60) Provisional application No. 61/229,171, filed on Jul. 28, 2009.

(51) Int. Cl.
  *G02B 6/36* (2006.01)
(52) U.S. Cl.
  USPC .................................. 385/88; 385/14; 385/53
(58) Field of Classification Search
  USPC .................................. 385/14, 53, 88
  See application file for complete search history.

(56) References Cited

U.S. PATENT DOCUMENTS

| | | | |
|---|---|---|---|
| 4,722,586 A | 2/1988 | Dodson et al. | 385/92 |
| 5,682,453 A | 10/1997 | Daniel et al. | 385/99 |
| 5,692,086 A | 11/1997 | Beranek et al. | 385/94 |
| 5,926,599 A | 7/1999 | Bookbinder et al. | 385/137 |
| 6,075,914 A | 6/2000 | Yeandle | 385/49 |
| 6,574,411 B2 | 6/2003 | Seguin | 385/137 |
| 6,734,517 B2 | 5/2004 | Miyokawa et al. | 257/436 |
| 6,758,610 B2 | 7/2004 | Ziari et al. | 385/92 |
| 6,883,978 B2 | 4/2005 | Powers | 385/92 |
| 6,961,357 B2 | 11/2005 | Moriya et al. | 372/34 |
| 7,030,422 B2 | 4/2006 | Miyokawa et al. | 257/98 |
| 7,062,133 B2 | 6/2006 | Azimi et al. | 385/52 |
| 7,263,266 B2 | 8/2007 | Williamson | 385/137 |
| 7,293,922 B2 | 11/2007 | Massey | 385/91 |
| 7,409,125 B2 | 8/2008 | Azimi et al. | 385/52 |
| 2004/0033034 A1 * | 2/2004 | Miyokawa et al. | 385/93 |
| 2011/0026558 A1 * | 2/2011 | Raju et al. | 372/50.1 |

* cited by examiner

*Primary Examiner* — Jennifer Doan
(74) *Attorney, Agent, or Firm* — Matthew A. Pequignot; Pequignot + Myers LLC

(57) ABSTRACT

A fiber coupled semiconductor device having an improved optical stability with respect to temperature variation is disclosed. The stability improvement is achieved by placing the platform holding the semiconductor chip and the optical fiber onto a spacer mounted on a base. The spacer has an area smaller than the area of the platform, for mechanical decoupling of thermally induced deformation of the base from a deformation of the platform of the semiconductor device. Attaching the optical fiber to a vertical mounting surface of a fiber mount, and additionally attaching the fiber mount to a submount of the semiconductor chip further improves thermal stability of the packaged device.

17 Claims, 5 Drawing Sheets

SEMICONDUCTOR DEVICE ASSEMBLY

CROSS-REFERENCE TO RELATED APPLICATIONS

The present invention claims priority from U.S. Provisional Patent Application No. 61/229,171, filed Jul. 28, 2009, which is incorporated herein by reference.

TECHNICAL FIELD

The present invention relates to packaging of semiconductor devices, and in particular to athermal packaging of fiber-coupled semiconductor devices.

BACKGROUND OF THE INVENTION

Light-emitting semiconductor devices, such as laser diodes, laser diode arrays, and light emitting diodes (LEDs), are frequently used in conjunction with optical fibers for delivering emitted light to external objects. The efficiency of optical coupling between a semiconductor chip and an optical delivery fiber must be maintained during normal operation of the fiber coupled semiconductor device.

A light emitting area of most semiconductor chips is quite small, measuring only a few microns in a direction perpendicular to a plane of thin film layers of the semiconductor device. Generally, small size of the light emitting area is a good, desirable property of a light source, because it is associated with high brightness of the source, allowing the light from the source to be tightly focused, for example. To preserve the brightness of the semiconductor source, it is preferable to use optical fibers having small core diameter. Due to small dimensions of the light emitting area and the small fiber core diameter, the optical fiber has to be precisely aligned to the semiconductor chip. Furthermore, to maintain the emitted power level over a lifetime of the device, the precise alignment between the optical fiber and the semiconductor chip must be maintained over lifetime of the device.

Referring to FIG. 1, a prior-art fiber-coupled laser diode assembly 10 is shown. The laser diode assembly 10 has been disclosed by Ziari et al. in U.S. Pat. No. 6,758,610 assigned to JDS Uniphase Corporation and incorporated herein by reference. The laser diode assembly 10 includes a base 11, a laser chip submount 12, a laser chip 13, a fiber sub-mount 14 including a top section 14A, and an optical fiber 15. The submounts 12 and 14 are affixed to the base 11 with solder layers 16, and the laser chip 13 is affixed to the laser chip submount 12 with the solder layer 16. A solder bead 17 is used to connect the optical fiber 15 to the fiber submount 14. The fiber 15 is metalized to have a metallization layer 18 for improving wettability of the optical fiber 15 by the metal solder material of the bead 17. The top section 14A has low thermal conductivity to serve as a thermal barrier during soldering operation. A front surface 19 of the optical fiber 15 is lensed to improve fiber coupling efficiency.

Disadvantageously, the fiber coupling efficiency of the laser diode assembly 10 can vary with ambient temperature even in cases when the laser diode assembly 10 is temperature stabilized using a thermoelectric cooler (TEC). The TEC is not shown in FIG. 1. To remove the heat from the laser diode assembly 10, the base 11 is attached to a top surface of the TEC, and a bottom surface of the TEC is connected to an external heat sink, not shown. When the ambient temperature is different from the temperature of the base 11 of the laser diode assembly 10, the inside and the outside surfaces of the TEC are at different temperatures. The temperature difference results in deformation of the inside TEC surface on which the base 11 is mounted, which causes the base 11 of the laser diode assembly 10 to deform. The deformation of the base 11 results in misalignment of the optical fiber 15 relative to the laser diode chip 13, which results in a loss of optical fiber coupling efficiency, ultimately leading to a reduction of output optical power and the conversion efficiency of the laser diode assembly 10.

One prior-art approach to improving stability of fiber coupling efficiency in a fiber coupled diode laser is disclosed by Miyokawa et al. in U.S. Pat. Nos. 6,734,517 and 7,030,422, incorporated herein by reference. Miyokawa et al. disclose a semiconductor laser diode module constructed so as to reduce the temperature dependence of the fiber coupling efficiency. In the semiconductor laser diode module of Miyokawa et al., the material of a base for supporting a laser chip is selected to match that of a fiber holder. Further, the fiber holder has two parts, one of which is mounted to the base and the other supports the fiber ferrule. The part that is mounted to the base is shaped so that it does not interfere with the laser diode mounting region of the base. Disadvantageously, the module of Miyokawa et al. is rather complex, requiring many laser welding spots to affix all the parts of all the holder elements.

It is a goal of the present invention to provide a simple and inexpensive fiber coupled semiconductor device, in which the fiber coupling efficiency is maintained during normal operation at a varying ambient temperature. It is also a goal of the invention to provide a method of assembly of such a device.

SUMMARY OF THE INVENTION

The inventors discovered that loss of the alignment between the optical fiber and the laser chip was primarily caused by deformation of a platform supporting the laser diode subassembly. The inventors further discovered that providing a heat conducting spacer beneath the platform, having an area smaller than the area of the platform, significantly reduces deformation of the platform while providing sufficient heat sinking to keep the laser chip at the required temperature.

In accordance with the invention there is provided an assembly comprising:
  a base;
  a spacer mounted on the base;
  a semiconductor device subassembly including a platform having a bottom surface with a platform mounting area mounted on the spacer, and a semiconductor chip having an active layer, the semiconductor chip thermally coupled to the platform for removing heat from the semiconductor chip;
  a fiber mount attached to the semiconductor device subassembly, the fiber mount having a fiber mounting plane; and
  an optical fiber attached to the fiber mount in the fiber mounting plane and optically coupled to the semiconductor chip for receiving light therefrom;
  wherein the platform mounting area is smaller than a total area of the bottom surface of the platform, whereby sensitivity of the optical coupling between the semiconductor chip and the optical fiber to deformation of the base is lessened.

In one embodiment of the invention, a plane of the active layer is perpendicular to the fiber mounting plane, for reduction of sensitivity of the optical coupling between the semiconductor chip and the optical fiber to a variation of temperature of the assembly.

According to another aspect of the invention, the semiconductor device subassembly further includes a submount including a bottom surface with a submount mounting area mounted on the platform, for supporting the semiconductor chip and for thermally coupling the semiconductor chip to the platform. The fiber mount is preferably attached directly to the submount, to lessen sensitivity of the optical coupling between the semiconductor chip and the optical fiber to deformation of the base.

In accordance with yet another aspect of the invention there is further provided a method of assembly of a semiconductor device, including:

(a) providing a base;
(b) mounting a spacer on the base;
(c) providing a semiconductor device subassembly including: a platform having a bottom surface with a platform mounting area; a semiconductor chip having an active layer, the semiconductor chip thermally coupled to the platform for removing heat from the semiconductor chip; a fiber mount attached to the semiconductor device subassembly, the fiber mount having a fiber mounting plane; and an optical fiber attached to the fiber mount in the fiber mounting plane and optically coupled to the semiconductor chip for receiving light therefrom; and
(d) mounting the platform mounting area on the spacer so that the platform mounting area is smaller than a total area of the bottom surface of the platform, whereby sensitivity of the optical coupling between the semiconductor chip and the optical fiber to deformation of the base is lessened.

BRIEF DESCRIPTION OF THE DRAWINGS

Exemplary embodiments will now be described in conjunction with the drawings in which.

DETAILED DESCRIPTION OF THE INVENTION

While the present teachings are described in conjunction with various embodiments and examples, it is not intended that the present teachings be limited to such embodiments. On the contrary, the present teachings encompass various alternatives, modifications and equivalents, as will be appreciated by those of skill in the art.

Figure 2:
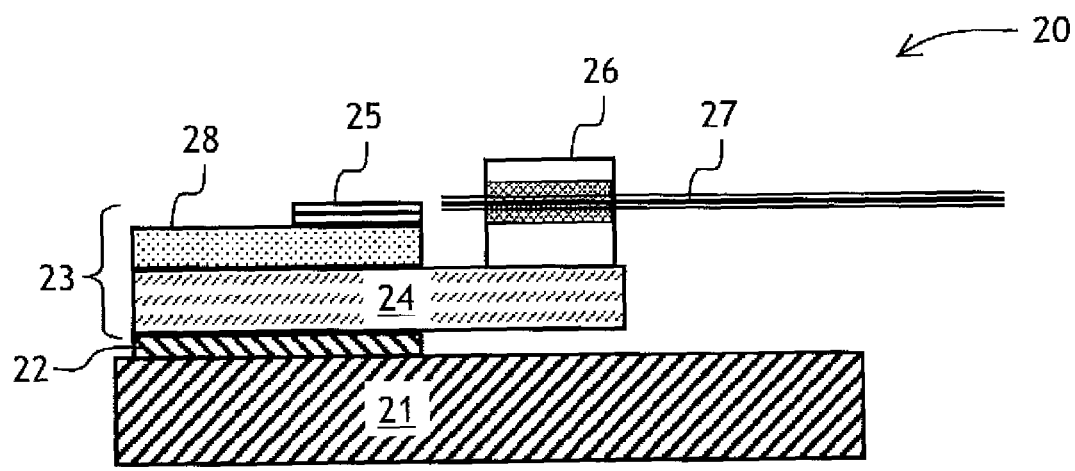
FIG. 2 is a side cross-sectional view of a semiconductor device assembly according to the present invention.

Referring to FIG. 2, a semiconductor device assembly 20 of the present invention includes a base 21, a spacer 22 mounted on the base 21, a semiconductor device subassembly 23 mounted on the spacer 22, a fiber mount 26 attached to the semiconductor device subassembly 23, and an optical fiber 27 attached to the fiber mount 26. The semiconductor device subassembly 23 includes a platform 24, a submount 28 mounted on the platform 24, and a semiconductor chip 25 mounted on the submount 28. The semiconductor chip 25 is thermally coupled to the platform 24 through the submount 28. The semiconductor chip 25 is optically coupled to the optical fiber 27 to receive light from an active layer, not shown, of the semiconductor chip 25. The submount 28 is optional. When a submount is not used, the semiconductor chip 25 is mounted directly on the platform 24. The bottom surface of the platform 24 includes a mounting area in contact with the spacer 22. The mounting area of the platform 24 is smaller than a total area of the bottom surface of the platform 24, such that a deformation of the base 21 does not impart, or at least reduces, a deformation of the platform 24. As a result, sensitivity of the optical coupling between the semiconductor chip 25 and the optical fiber 27 to a deformation of the base 21 is lessened. Since the deformation of the base 21 is caused by a change of ambient temperature, as explained above, the sensitivity of the optical coupling to such ambient temperature changes is also lessened.

The semiconductor chip 25 is preferably a laser diode chip, but it can be any other type of a semiconductor chip that emits light, for example a light-emitting diode (LED) chip. The fiber 27 is preferably a lensed optical fiber having an anamorphic fiber lens at its tip for improving optical coupling between the semiconductor chip 25 and the fiber 27. The anamorphic lens can include a biconic or a chisel lens having a focusing power in two planes or only in one plane, a cylindrical lens, and the like. Furthermore, a non-anamorphic fiber lens, such as a conical lens formed at the fiber tip, can be used. A separate lens can also be used. Alternatively, the fiber 27 can be butt-coupled to the semiconductor chip 25.

Preferably, a plane of the active layer of the semiconductor chip 25 is perpendicular to the mounting plane of the optical fiber 27. For example, in the side view of FIG. 2, the plane of the active layer is horizontal, and the fiber mounting plane is vertical, that is, parallel to the plane of FIG. 2. The vertical mounting of the optical fiber 27 reduces thermal dependence of the optical coupling between the horizontally mounted semiconductor chip 25 and the optical fiber 27. An explanation of this advantageous effect will be given further below.

In one embodiment, a length of the mounting area of the submount 28 on the platform 24 is between 30% and 80% of a length of the mounting area of the platform 24 on the spacer 22. These lengths are measured in a direction of a length of the optical fiber 27. It is also desirable that the submount mounting area be disposed directly over the platform mounting area, as shown in FIG. 2. Both of these structural features result in lessening of mechanical stress at the semiconductor chip 25 and improve optical stability.

The spacer 22 is preferably made of a material with high thermal conductivity, such as aluminum nitride or copper. By way of example, the thermal conductivity of the spacer 22 can be between 200 W/m*K and 400 W/m*K. The base 21 can be made of an inexpensive steel, although other materials can also be used.

Figure 3:
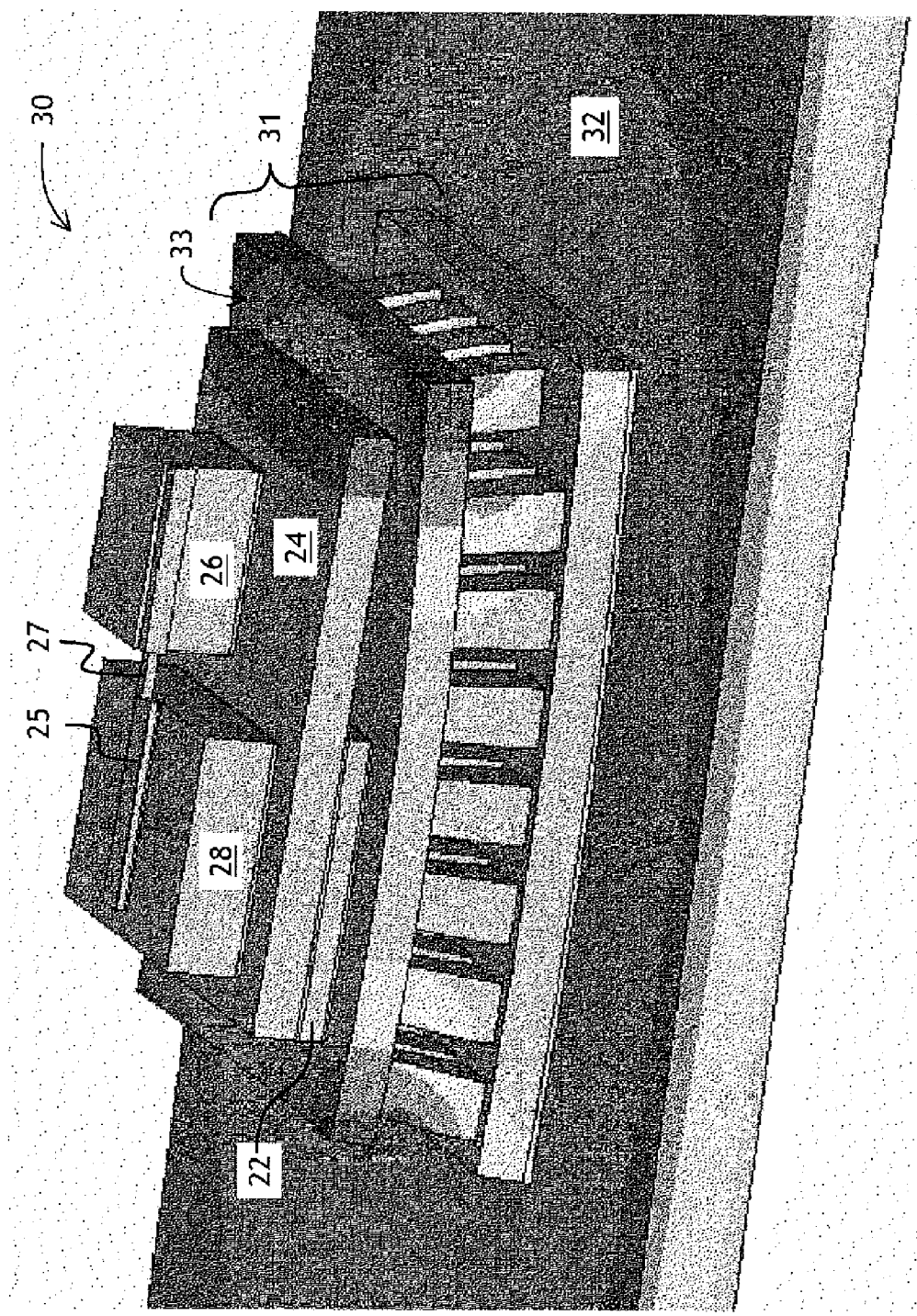
FIG. 3 is a three-dimensional view of the semiconductor device assembly of FIG. 2 mounted on a thermoelectric cooler (TEC), showing, in exaggerated form, deformation of the TEC.

Turning to FIG. 3, a semiconductor device assembly 30 is shown in a three-dimensional view. The semiconductor device assembly 30 is similar to the semiconductor device assembly 20 of FIG. 2, having the spacer 22, the platform 24, the submount 28, the semiconductor device chip 25, the fiber mount 26, and the optical fiber 27, with the exception that the base 21 is replaced with an upper plate 33 of a thermoelectric cooler (TEC) 31. The TEC 31 is mounted on an external heat sink 32. The TEC is required to maintain the semiconductor device chip 25 at a working temperature, and the external heat sink is required to remove the heat released by TEC operation. The TEC 31 is shown deformed due to the temperature difference created by TEC operation, as explained above. The deformation of the TEC 31 is exaggerated to illustrate the advantage of using the spacer 22.

It is seen from FIG. 3 that, due to the presence of the spacer 22, the deformation of the upper plate 33 of the TEC 31 does not result in deformation of the platform 24, whereby sensitivity of the optical coupling between the semiconductor chip 25 and the optical fiber 27 to deformation of the base, in this case the upper plate 33 of the TEC 31, is lessened.

Figure 4A:
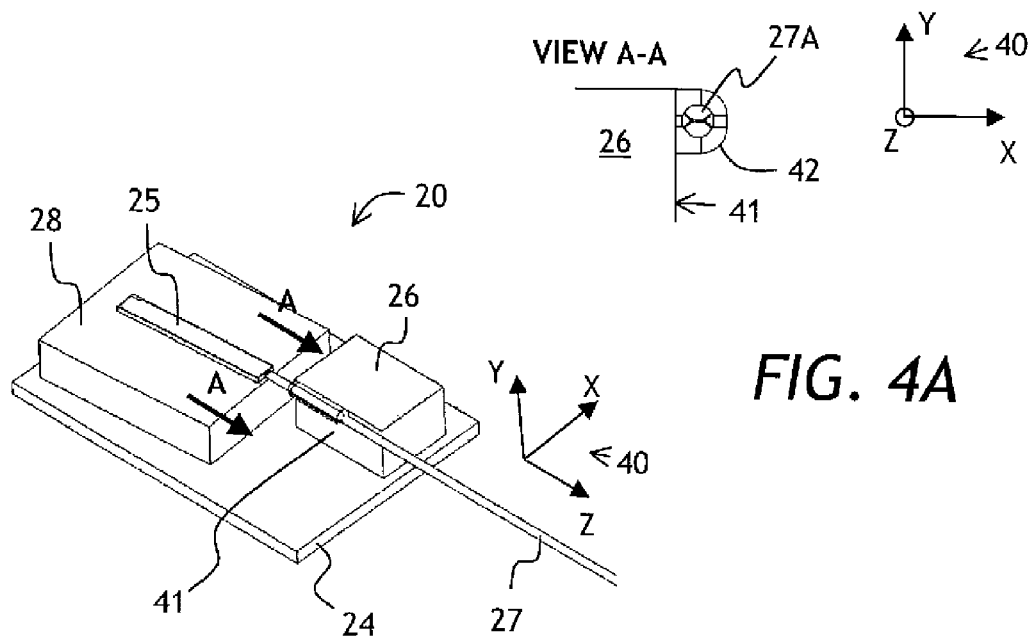
FIGS. 4A and 4B are isometric views of the laser diode assembly of FIG. 2 showing attachment of a lensed optical fiber to a vertical surface.
Figure 4B:
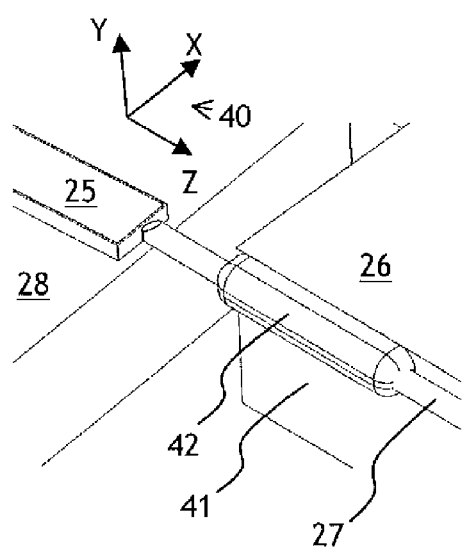

Referring now to FIGS. 4A and 4B, the semiconductor chip 25 is disposed in the XZ plane, as an XYZ coordinate system 40 indicates. The optical fiber 27 is attached to a vertical surface 41 of the fiber mount 26, disposed in the YZ plane. Thus, the plane of the semiconductor device 25 is perpendicular to the plane of the vertical surface 41, which the optical fiber 27 is mounted to. This geometry of fiber attachment results in improved stability of optical coupling with respect to the temperature changes, for the following reason.

Figure 1:
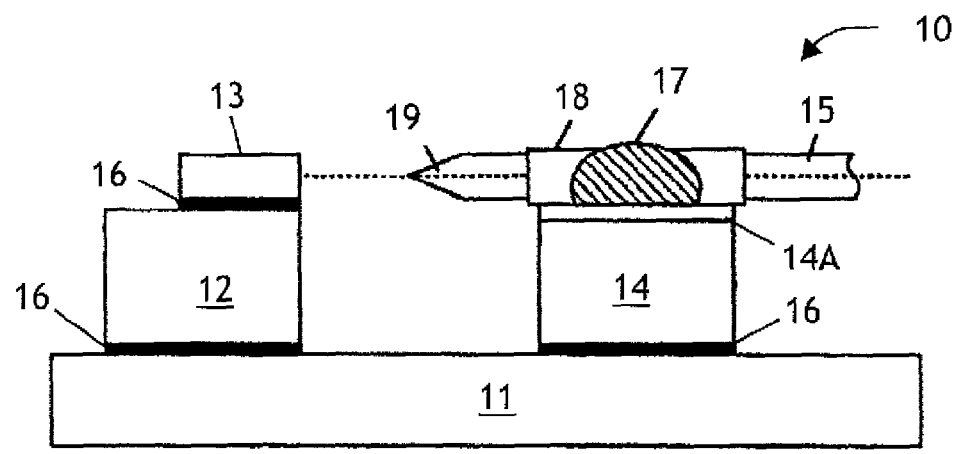
FIG. 1 is a side view of a prior-art fiber-coupled laser diode assembly.

The optical fiber 27 is attached, preferably using a ultraviolet-curable (UV) epoxy 42, to the vertical surface 41. When the fiber 27 is attached, it bends somewhat in the XZ plane due to thermal mismatches between the fiber 27, the fiber mount 26, and the epoxy 42. When temperature changes, the degree of bending changes, which results in movement of a tip of the fiber 27 along the X axis. If the fiber 27 were attached to a horizontal surface (parallel to the XZ plane), as is common in the prior art and as is in fact shown on the prior-art FIG. 1, then the fiber tip would be moving along the Y axis. However, moving along the Y axis results in a higher decrease of the fiber coupling efficiency because the spot size of the light emitting area of the semiconductor chip 25 is almost always smaller in the Y-direction than in the X-direction. Therefore, mounting the fiber 27 to the vertical surface 41 of the fiber mount 26 results in an improvement of stability of the optical coupling in the semiconductor device assembly 20. Advantageously, the improved stability is observed not only during normal operation of the semiconductor device assembly 20, but also during building of the semiconductor device assembly 20.

Referring specifically to view A-A in FIG. 4A, the optical fiber 27 is a lensed optical fiber having an anamorphic fiber lens 27A at its tip for improving the coupling efficiency. The fiber lens 27A is anamorphic because, as noted above, the semiconductor chip 25 has an anamorphic light field, which needs to be coupled into the round optical fiber 27. The anamorphic fiber lens 27A has mutually orthogonal first and second optical planes parallel to the XZ and YZ planes. The strength of focusing by the anamorphic fiber lens 27A in the first plane is generally different from the degree of focusing in the second plane.

Figure 5:
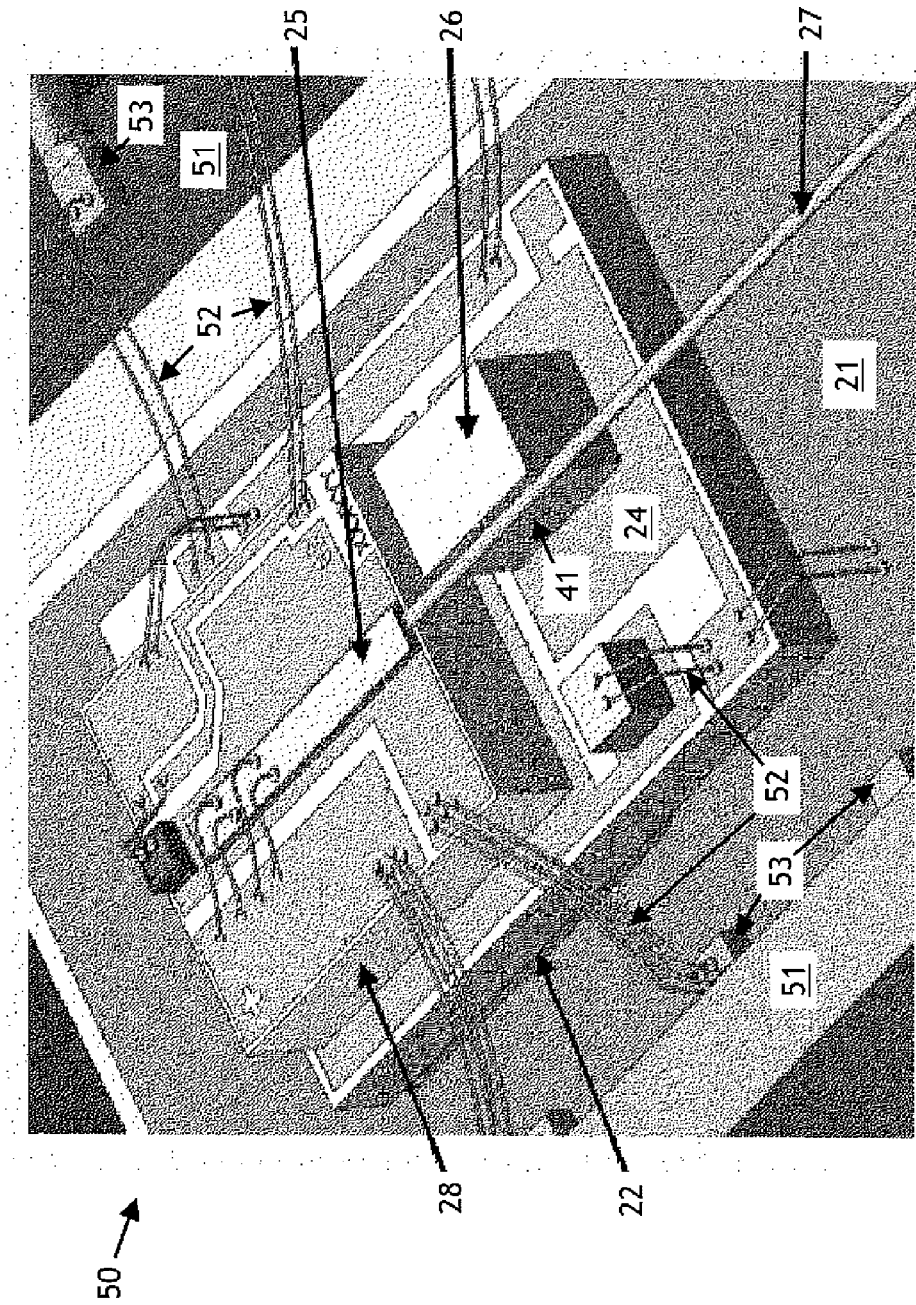
FIG. 5 is an isometric rendering of a packaged laser diode assembly of the invention.

Turning now to FIG. 5, a packaged laser diode assembly 50 has all the elements of the semiconductor device assembly 20 of FIGS. 2, 4A, and 4B, including the base 21, the spacer 22 mounted on the base 21, the platform 24 mounted on the spacer 22, the submount 28 mounted on the platform 24, the semiconductor device chip 25 mounted on the submount 28, the fiber mount 26 mounted on the platform 24, and the optical fiber 27 mounted to the vertical surface 41 of the submount 26. The laser diode assembly 50 also includes a frame 51 (only partially seen in FIG. 5) for enclosing the semiconductor device assembly 20, wirebonds 52 for providing necessary electrical connections, and electrodes 54 connected to the wirebonds 52, for feeding the electrical connections through the frame 51 to an external controller of the laser diode assembly 50. The base 21 is attached to a bottom of the frame 51. Alternatively, the base 21 is a part of the frame 51.

Figure 6:
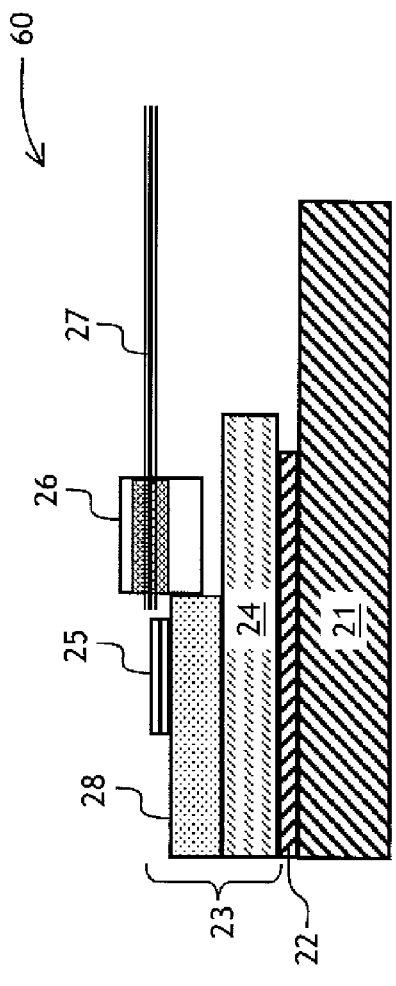
FIG. 6 a side cross-sectional view of a semiconductor device assembly of the invention, having fiber mount attached to the laser diode chip submount.

Referring to FIG. 6, a semiconductor device assembly 60 has the same elements as the semiconductor device assembly 20 of FIGS. 2, 4A, and 4B. One difference between the semiconductor assemblies 20 and 60 is that in the semiconductor device assembly 60, the fiber mount 26 is attached to the laser diode chip submount 28 and not to the platform 24. This additionally improves stability of the optical coupling with respect to deformation of the base 21, because the deformation of the platform 24 has practically no impact on the position of the fiber mount 26. Preferably, the optical fiber 27 is mounted to the side 41 of the fiber mount 26. Further, preferably, the optical fiber is lensed, having the anamorphic lens 27A at its tip.

Figure 7:
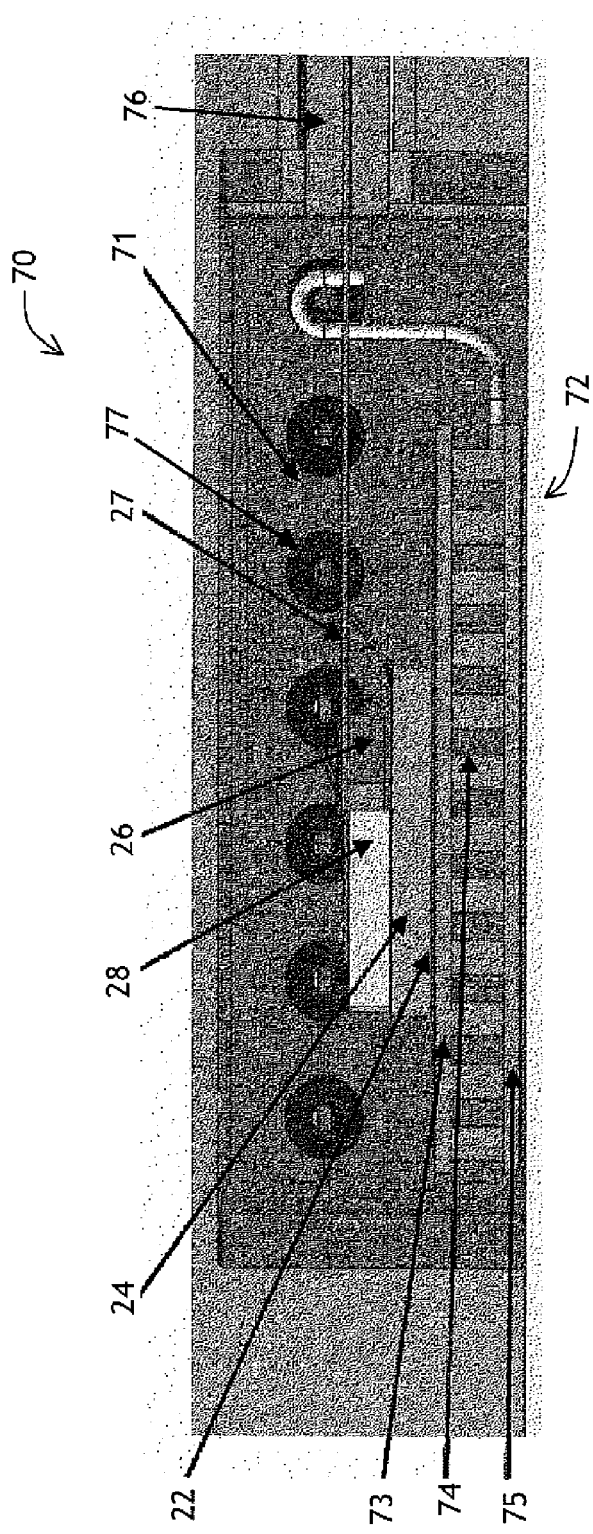
FIG. 7 is a side cross-sectional view of the semiconductor device assembly of FIG. 6 mounted on a TEC and hermetically packaged.

Turning now to FIG. 7, a packaged semiconductor device assembly 70 of the invention has the same elements as the semiconductor device assembly 60 of FIG. 6, except for the base 21, which is replaced with a TEC 72 having an upper plate 73, a plurality of Peltier elements 74, and a bottom plate 75. The TEC 72 is mounted within a hermetic package 71 having a feedthrough 76 for the optical fiber 27 and electrical feedthroughs 77 for the electrical contacts. The fiber mount 26 is connected to the submount 28. The optical fiber 27 is attached to the fiber mount 26 preferably using a UV curable epoxy. Using UV epoxy is advantageous because it allows one to quickly attach elements together without heating. One drawback of at least some types of UV epoxies compared to other types of epoxies is the increased sensitivity to moisture, however this is not a concern where the hermetically sealed package 71 is used. Of course, other types of epoxies can be used, as well as glass or metal soldering, brazing, or laser welding. A non-hermetic package is also usable, although a hermetic package is generally preferable.

The semiconductor device assemblies 20, 30, 50, 60, and 70 can be manufactured following the general steps of:
  providing the base 21 and/or the TEC 31 or 72 on which the subassembly 23 will be mounted;
  providing the spacer 22 and mounting the spacer 22 on the base 21 and/or TEC;
  providing the subassembly including the semiconductor chip 25 mounted on the submount 28 mounted on the platform 24, and an optical fiber 27 aligned for optical coupling to the semiconductor chip 25 and mounted on the fiber mount 26 attached to the platform 24 or directly to the submount 28, as the case may be;
  mounting the platform 24 on the spacer 22 so that the platform mounting area is smaller than a total area of the bottom surface of the platform 24. As noted above, this way of mounting helps reducing sensitivity of the optical coupling between the semiconductor chip 25 and the optical fiber 27 to deformation of the base 21.

In step (c) above, the subassembly is aligned on the platform 24, which is subsequently attached to the spacer 22. This alleviates the need to have the TEC 31 or 72 in the precision alignment setup. Of course, the subassembly can be aligned already mounted on the TEC 31 or 72, as well. The step (c) can include a sub-step (c1) of aligning the optical fiber 27 to the semiconductor chip 25 for receiving light therefrom, and a sub-step (c2) of attaching the optical fiber 25 to the fiber mount 26 such that a plane of the active layer (XZ plane) is perpendicular to the fiber mounting plane (YZ plane). For the devices where the submount 28 is used, the step (c) includes mounting the submount 28 on the platform 24 and mounting the semiconductor chip 25 to the submount 28, not necessarily in the exact order stated. For the semiconductor device assemblies 60 and 70, the step (c) also includes mounting the fiber mount 26 to the submount 28.

What is claimed is:

1. A semiconductor device assembly comprising:
    a thermoelectric cooler;
    a heat conducting spacer mounted on the thermoelectric cooler;
    a semiconductor device subassembly including:
        a platform having a bottom surface with a platform mounting area mounted on the spacer; and
        a semiconductor chip extending in a first plane, the semiconductor chip thermally coupled to the platform for removing heat from the semiconductor chip;
    a fiber mount attached to the semiconductor device subassembly, the fiber mount having a fiber mounting surface; and
    an optical fiber attached to the fiber mounting surface and optically coupled to the semiconductor chip for receiving light therefrom;
    wherein the platform mounting area is smaller than a total area of the bottom surface of the platform, whereby sensitivity of the optical coupling between the semiconductor chip and the optical fiber to deformation of the thermoelectric cooler is lessened.

2. The semiconductor device assembly of claim 1,
    wherein the first plane is perpendicular to the fiber mounting surface, whereby a dependence of the optical coupling between the semiconductor chip and the optical fiber on temperature of the assembly is lessened,
    wherein the optical fiber is a lensed optical fiber having an anamorphic fiber lens having mutually orthogonal first and second optical planes parallel to the first plane and the fiber mounting surface, respectively.

3. The semiconductor device assembly of claim 1, wherein the semiconductor device subassembly further includes a submount including a bottom surface with a submount mounting area mounted on the platform, for supporting the semiconductor chip and for thermally coupling the semiconductor chip to the platform.

4. The semiconductor device assembly of claim 3, wherein the fiber mount is attached to the submount, whereby sensitivity of the optical coupling between the semiconductor chip and the optical fiber to deformation of the thermoelectric cooler is lessened.

5. The semiconductor device assembly of claim 4, wherein the first plane is perpendicular to the fiber mounting surface, whereby a dependence of the optical coupling between the semiconductor chip and the optical fiber on temperature of the assembly is lessened.

6. The semiconductor device assembly of claim 5, wherein the optical fiber is a lensed optical fiber having an anamorphic fiber lens having mutually orthogonal first and second optical planes parallel to the first plane and the fiber mounting surface, respectively.

7. The semiconductor device assembly of claim 3, wherein the submount mounting area and the platform mounting area each have a length in a direction of a length of the optical fiber, wherein the length of the submount mounting area is between 30% and 80% of the length of the platform mounting area.

8. The semiconductor device assembly of claim 7, wherein the submount mounting area is disposed over the platform mounting area.

9. A packaged diode laser assembly including:
    the semiconductor device assembly of claim 1, wherein the semiconductor chip is a laser chip, and wherein the semiconductor device subassembly is a semiconductor laser subassembly, and
    a frame for enclosing the semiconductor laser subassembly and the fiber mount, wherein the thermoelectric cooler is attached to inside of the frame.

10. The packaged diode laser assembly of claim 9, wherein the frame is a hermetic package having a feedthrough for the optical fiber.

11. The semiconductor device assembly of claim 1, wherein the semiconductor chip is a laser chip, and wherein the semiconductor device subassembly is a semiconductor laser subassembly.

12. The semiconductor device assembly of claim 1, wherein a material of the spacer includes aluminum nitride or copper.

13. The semiconductor device assembly of claim 1, wherein a material of the base includes steel.

14. A method of assembly of a semiconductor device, including:
    (a) providing a thermoelectric cooler;
    (b) mounting a heat conducting spacer on the thermoelectric cooler;
    (c) providing a semiconductor device subassembly including: a platform having a bottom surface with a platform mounting area; a semiconductor chip extending in a first plane, the semiconductor chip thermally coupled to the platform for removing heat from the semiconductor chip; a fiber mount attached to the semiconductor device subassembly, the fiber mount having a fiber mounting surface; and an optical fiber attached to the fiber mounting surface and optically coupled to the semiconductor chip for receiving light therefrom; and
    (d) mounting the platform mounting area on the spacer so that the platform mounting area is smaller than a total area of the bottom surface of the platform, whereby sensitivity of the optical coupling between the semiconductor chip and the optical fiber to deformation of the thermoelectric cooler is lessened.

15. The method of claim 14, wherein the semiconductor device subassembly further includes a submount including a bottom surface with a submount mounting area,
    wherein step (c) includes:
    (c3) mounting the submount mounting area on the platform, for supporting the semiconductor chip and for thermally coupling the semiconductor chip to the platform.

16. The method of claim 15, wherein step (c) further includes
    (c4) attaching the fiber mount to the submount, for lessening sensitivity of the optical coupling between the semiconductor chip and the optical fiber to deformation of the thermoelectric cooler.

17. The semiconductor device of claim 1, wherein the spacer has a thermal conductivity of between 200W/m*K and 400W/m*K.

* * * * *